US010541360B2

(12) United States Patent
Mardilovich et al.

(10) Patent No.: US 10,541,360 B2
(45) Date of Patent: Jan. 21, 2020

(54) PIEZOELECTRIC THIN FILM ELEMENT

(71) Applicant: Xaar Technology Limited, Cambridge (GB)

(72) Inventors: Peter Mardilovich, Cambridge (GB); Song-Won Ko, Cambridge (GB); Susan Trolier-McKinstry, University Park, PA (US); Trent Borman, University Park, PA (US)

(73) Assignee: Xaar Technology Limited, Cambridge (GB)

( * ) Notice: Subject to any disclaimer, the term of this patent is extended or adjusted under 35 U.S.C. 154(b) by 0 days.

(21) Appl. No.: 16/085,378

(22) PCT Filed: Mar. 14, 2017

(86) PCT No.: PCT/GB2017/050696
§ 371 (c)(1),
(2) Date: Sep. 14, 2018

(87) PCT Pub. No.: WO2017/158345
PCT Pub. Date: Sep. 21, 2017

(65) Prior Publication Data
US 2019/0074428 A1    Mar. 7, 2019

(30) Foreign Application Priority Data

Mar. 16, 2016 (EP) .................................... 16160658
Mar. 16, 2016 (GB) .................................... 1604457.0

(51) Int. Cl.
*B41J 2/14* (2006.01)
*H01L 41/318* (2013.01)
(Continued)

(52) U.S. Cl.
CPC ........ *H01L 41/318* (2013.01); *B41J 2/14233* (2013.01); *B41J 2/161* (2013.01);
(Continued)

(58) Field of Classification Search
CPC ...... B41J 2/14233; B41J 2/161; B41J 2/1642; H01L 41/0805; H01L 41/1876; H01L 41/318
See application file for complete search history.

(56) References Cited

U.S. PATENT DOCUMENTS 6,620,237 B2   9/2003  Hoisington
6,682,772 B1   1/2004  Fox et al.
(Continued)

FOREIGN PATENT DOCUMENTS

EP    2 306 539 A1    4/2011
EP    2525391 A2    11/2012
(Continued)

OTHER PUBLICATIONS

International Search Report and Written Opinion dated Jun. 14, 2017, in International Application No. PCT/GB2017/050696 (8 pages.).
(Continued)

*Primary Examiner* — Juanita D Jackson
(74) *Attorney, Agent, or Firm* — Finnegan, Henderson, Farabow, Garrett & Dunner LLP

(57) ABSTRACT

A piezoelectric thin film element comprising a first electrode, a second electrode and one or more piezoelectric thin films there between wherein the first electrode is a platinum metal electrode having an average grain size greater than 50 nm and wherein a piezoelectric thin film adjacent the platinum metal electrode comprises a laminate having a plurality of piezoelectric thin film layers wherein a piezoelectric thin film layer contacting the platinum metal electrode comprises lead zirconate titanate (PZT) of composition at or about $PbZr_xTi_{1-x}O_3$ where $0<x\leq0.60$ and has a degree of pseudo cubic $\{100\}$ orientation greater than or equal to 90%.

20 Claims, 6 Drawing Sheets

(51) Int. Cl.
*H01L 41/08* (2006.01)
*H01L 41/187* (2006.01)
*B41J 2/16* (2006.01)
*H01L 41/047* (2006.01)
*H01L 41/29* (2013.01)

(52) U.S. Cl.
CPC ........ *B41J 2/1642* (2013.01); *H01L 41/0805* (2013.01); *H01L 41/1876* (2013.01); *B41J 2002/14266* (2013.01); *H01L 41/0477* (2013.01); *H01L 41/29* (2013.01)

(56) References Cited

U.S. PATENT DOCUMENTS

| | | |
|---|---|---|
| 7,023,036 B2 | 4/2006 | Watanabe et al. |
| 7,291,959 B2 | 11/2007 | Miyazawa et al. |
| 2003/0156163 A1 | 8/2003 | Watanabe et al. |
| 2005/0146772 A1 | 7/2005 | Murata et al. |
| 2005/0185026 A1 | 8/2005 | Noguchi et al. |
| 2008/0224569 A1 | 9/2008 | Ohashi et al. |
| 2008/0224571 A1 | 9/2008 | Miyazawa et al. |
| 2011/0074890 A1 | 3/2011 | Miyazawa et al. |
| 2011/0164098 A1* | 7/2011 | Kobayashi et al. ............ 347/71 |
| 2013/0187516 A1* | 7/2013 | Suenaga et al. .............. 310/360 |
| 2014/0084753 A1* | 3/2014 | Shibuya .......................... 310/65 |
| 2014/0267509 A1 | 9/2014 | Shinkai et al. |
| 2016/0020381 A1* | 1/2016 | Arakawa ............. H01L 41/1876 |

FOREIGN PATENT DOCUMENTS

| | | |
|---|---|---|
| EP | 2525393 A2 | 11/2012 |
| EP | 2846370 A1 | 3/2015 |
| JP | 2006-032628 A | 2/2006 |

OTHER PUBLICATIONS

Communication Pursuant to Article 94(3) EPC, dated Jun. 19, 2018, in EP Application No. 16 160 658.7. (4 pages).
Combined Search and Examination Report Under Sections 17 and 18(3), dated Aug. 19, 2016, in GB Application No. 1604457.0. (6 pages).

* cited by examiner

PIEZOELECTRIC THIN FILM ELEMENT

This application is a National Stage Entry of International Application No. PCT/GB2017/050696, filed Mar. 14, 2017, which is based on and claims the benefit of foreign priority under 35 U.S.C. § 119 to GB Application No. 1610658.7, filed Mar. 16, 2016, and EP Application No. 16044457.0. The entire contents of the above-referenced applications are expressly incorporated herein by reference.

The present disclosure is generally concerned with a piezoelectric thin film element suitable for use in actuators, sensors, energy-harvesting devices and in multilayer capacitors as well as a method of manufacturing the element.

The present disclosure is particularly, although not exclusively, concerned with a piezoelectric thin film element suitable for use as an actuator for a droplet deposition head in a droplet deposition apparatus, as well as with actuators including the element, droplet deposition heads including the actuator and droplet deposition apparatus including the droplet deposition heads.

A variety of alternative fluids may be deposited by a droplet deposition head. For instance, a droplet deposition head may eject droplets of ink that may travel to a sheet of paper or card, or to other receiving media, such as ceramic tiling or shaped articles (for example, cans, bottles etc) to form an image, as is the case in inkjet printing applications (where the droplet deposition head may be an inkjet printhead or, more particularly, a drop-on-demand inkjet printhead).

Alternatively, droplets of fluids may be used to build structures, for example, electrically active fluids may be deposited onto receiving media such as a circuit board so as to enable prototyping of electrical devices.

In another example, polymer containing fluids or molten polymer may be deposited in successive layers so as to produce a prototype model of an object (as in 3D printing).

In still other applications, droplet deposition heads might be adapted to deposit droplets of solution containing biological or chemical material onto a receiving medium such as a microarray.

Droplet deposition heads suitable for such alternative fluids may be generally similar in construction to printheads with some adaptations made to handle the specific fluid in question.

Droplet deposition heads may be drop-on-demand droplet deposition heads wherein the pattern of droplets ejected varies in dependence on the input data provided to the head.

A typical piezoelectric thin film element suitable for use as an actuator for a droplet deposition head comprises a metal or metal oxide bottom electrode formed on a silicon or other substrate, a metal top electrode and a piezoelectric thin film interposed between the electrodes.

The piezoelectric thin film may comprise a lead-containing perovskite ($ABO_3$) such as lead zirconate titanate (PZT) and be formed by a variety of techniques including sputtering, physical vapour deposition (PVD), chemical vapour deposition (CVD), pulsed laser deposition (PLD), atomic layer deposition (ALD) and chemical solution deposition. The most commonly employed technique, however, is chemical solution deposition, and in particular, sol-gel deposition.

In a chemical solution deposition, the piezoelectric thin film is formed as a laminate comprising a plurality of piezoelectric thin film layers which have been individually formed and annealed together.

A solution is deposited on a bottom electrode (for example, by spin coating), dried and pyrolyzed to form a precursor layer for a first piezoelectric thin film layer. The precursor layer is then heat treated so that it anneals to form the first piezoelectric thin film layer as a crystalline thin film layer.

The solution is then applied to the first piezoelectric thin film layer, dried and pyrolyzed to form a precursor layer for the second piezoelectric thin film layer. The precursor layer is then heat treated so that it anneals to form the second piezoelectric thin film as a crystalline thin film layer.

These latter steps are repeated so as to obtain a piezoelectric thin film on the bottom electrode comprising a laminate having a plurality of piezoelectric thin film layers and an appropriate thickness for the intended use of the piezoelectric element.

The chemical solution deposition may form multiple precursor layers by repeated application, drying and pyrolysis of a solution prior to a heat treatment in order to control the thickness of the piezoelectric thin film layer and the piezoelectric thin film. These thicknesses also depend on the overall solute concentration of the solution as well as other parameters such as the rate of spin coating of the solution.

Finally, a top electrode is formed on the piezoelectric thin film, for example, by sputtering a metal such as platinum, iridium or ruthenium and/or by reactive sputtering of a metal oxide such as iridium dioxide.

The use of chemical solution deposition, and in particular sol-gel deposition, to form a piezoelectric thin film comprising a lead-containing perovskite such as a PZT is described in detail throughout the literature. One detailed description can be found, for example, in US patent application 2003/0076007 A1 (incorporated by reference herein).

The piezoelectric and mechanical properties of a PZT thin film are well known to depend on its microstructure and, in particular, on the size, form and orientation of the crystals (or "grains") within the piezoelectric thin film layers.

In particular, it is known that an excess lead content in solutions for forming the PZT thin film (typically 10%) is important for ensuring the perovskite phase and the avoidance of other (lead depleted) phases which are detrimental to piezoelectric performance.

It is also known that the magnitude of the piezoelectric constant of a PZT thin film is greatest when the chemical composition of PZT is close to that found at the morphotropic phase boundary (MPB) between tetragonal and rhombohedral phases (typically, at or about $PbZr_{0.52}Ti_{0.48}O_3$).

It is further known that the piezoelectric and mechanical properties of a piezoelectric element are best when the majority of crystals within the PZT thin film have a crystal orientation which is a pseudo cubic {100} orientation (viz., when the piezoelectric thin film has a "preferred {100} orientation").

It is further known that the crystal orientation in a PZT thin film is heavily influenced by the crystal structure of the underlying electrode and substrate but also depends on the process parameters used for the chemical solution deposition.

The process parameters which are known to influence crystal orientation in a piezoelectric thin film include the temperature, rate and duration of the drying, pyrolysis and heating used in the chemical solution deposition.

One approach to the control of crystal orientation in a PZT thin film formed by a chemical solution deposition provides a seed layer or a buffer layer provided on a bottom electrode.

The seed layer or buffer layer, which is formed with a well-defined crystal orientation, acts to direct crystal orientation in a PZT thin film layer when it is formed on the seed layer. This contacting PZT thin film layer directs orientation in a second PZT thin film layer when is formed on the contacting PZT thin film layer (and so on) so that a PZT thin film having an overall preferred orientation can be obtained.

A seed layer or buffer layer typically comprises a perovskite type material other than PZT. A commonly employed seed layer for directing pseudo cubic {100} orientation in a PZT thin film formed by a chemical solution deposition comprises lead titanate (PT).

However, a PZT thin film layer formed on an electrode by chemical solution deposition may also be used to direct (100) or (110) crystal orientation in a PZT thin film. In that case, the thickness of the PZT thin film layer is critical for (100) or (110) orientation in that layer and the PZT thin film.

In particular, EP 2 525 391 A2 discloses a method for forming a piezoelectric thin film having preferred (100) orientation by a chemical solution deposition in which a PZT thin film layer formed on a platinum electrode acts as a (100) orientation controlling layer. The solution has a solute content of 12 wt % with an excess lead content of 10 mol %. The thickness of the orientation controlling layer is controlled to be between 35 nm to 150 nm (and optimally to about 65 nm).

Further, EP 2 525 393 A2 discloses a method for forming a piezoelectric thin film having preferred (110) orientation by a chemical solution deposition in which a PZT thin film layer formed on a platinum electrode acts as a (110) orientation controlling layer. The solution has a solute content of 5 wt % and an excess lead content of 10 mol %. The thickness of the orientation controlling layer is controlled to be between 5 nm and 30 nm.

The use of a PZT thin film layer as an orientation-controlling layer in chemical solution deposition of PZT thin films has been confined to electrodes, in particular, platinum electrodes, which are deposited on a substrate by sputtering at or near room temperature.

U.S. Pat. No. 6,682,722 B1 discloses a method of manufacturing a platinum bottom electrode for a capacitor memory device based on a PZT thin film layer. The platinum electrode is deposited by sputtering platinum metal on a substrate (provided with an adhesion layer) which is heated to high temperature (between 300° C. and 800° C.). The platinum electrode, which directs {111} orientation in the PZT thin film, provides a device having higher thermal stability, lower stress and improved fatigue performance as compared to a capacitor in which a platinum electrode has been deposited by sputtering at or around room temperature.

U.S. 6 682 772 B1 discloses a method of manufacturing a platinum bottom electrode for a capacitor memory device based on a PZT thin film layer. The platinum electrode is deposited by sputtering platinum metal on a substrate (provided with an adhesion layer) which is heated to high temperature (between 300° C. and 800° C.). The platinum electrode, which directs {111} orientation in the PZT thin film, provides a device having higher thermal stability, lower stress and improved fatigue performance as compared to a capacitor in which a platinum electrode has been deposited by sputtering at or around room temperature.

U.S. Pat. No. 7,023,036 B1 discloses a piezoelectric element suitable for use in an actuator for an inkjet printer which includes a protection film intended to protect parts of the piezoelectric thin film which are exposed to the environment. The piezoelectric element comprises a platinum bottom electrode formed on a magnesium oxide substrate and a PZT thin film. The platinum bottom electrode, which directs (001) orientation in the PZT thin film, is deposited by sputtering platinum metal at 650° C.

EP 2 846 370 A1 discloses a piezoelectric element comprising a PZT thin film in which a lead lanthanate titanate (PLT) buffer layer is provided on a platinum bottom electrode. The platinum electrode is deposited by sputtering platinum metal on to a silicon substrate which is heated to high temperature so that the average grain size in the platinum electrode is controlled to between 50 nm and 150 nm. The crystallinity and the average grain size of the platinum electrode are said to control (100) orientation in the PLT buffer layer and the PZT thin film.

This document also discloses a piezoelectric element in which the PZT thin film is formed directly on the platinum electrode (viz., without the buffer layer). The PZT thin film is described as having (100) and (001) orientation and inferior piezoelectric constant as compared to the piezoelectric element including the buffer layer.

The piezoelectric elements of these disclosures each comprise a high-temperature deposited platinum electrode and a PZT thin film which is a monolayer formed by sputtering PZT at high temperature.

The use of a chemical solution deposition for forming a lead-containing piezoelectric thin film directly on a high-temperature deposited platinum electrode is not described or suggested by these disclosures.

Such use renews the problem of control of crystal orientation in PZT thin film layers because the degree of crystallinity and the grain size, morphology and density of a high-temperature deposited platinum electrode differ from that of a room-temperature deposited platinum electrode.

In particular, a high-temperature deposited platinum electrode comprises dense, highly crystallised grains of large average size (often 100 nm or higher) as compared to a room temperature deposited platinum electrode (20 nm to 50 nm).

The present disclosure provides for the control of pseudo cubic {100} orientation in a PZT thin film provided on a high-temperature deposited platinum electrode by a chemical solution deposition.

It has now been found that a piezoelectric thin film layer comprising PZT of composition at or about $PbZr_xTi_{1-x}O_3$ where $0<x\leq0.60$ can be deposited directly onto a high-temperature deposited platinum electrode by a chemical solution deposition with a very high degree of pseudo cubic {100} orientation simply by controlling the degree of excess lead content in the solution.

The degree of pseudo cubic {100} orientation of the PZT thin film layer can be as high as 98% or even 100% and is independent of the thickness of the PZT thin film layer—at least over the range of thicknesses typically employed for PZT thin film layers in piezoelectric elements.

It has also been found that the PZT thin film layer acts as an orientation-controlling layer for other piezoelectric thin film layers, and in particular PZT thin film layers of composition at or about $PbZr_xTi_{1-x}O_3$ where $0<x\leq0.60$, which are deposited one on the other on the PZT thin film layer.

The degree of pseudo cubic {100} orientation control exercised by the orientation controlling PZT thin film layer on these overlying piezoelectric thin film layers can be exceptionally high. The PZT thin film layer can, for example, provide a PZT thin film comprising a laminate of two to six or more PZT thin film layers which has an overall pseudo cubic {100} orientation greater than 90% and, in particular, greater than 95%.

Accordingly, in a first aspect, the present disclosure provides a piezoelectric thin film element comprising a first electrode, a second electrode and one or more piezoelectric thin films there between wherein the first electrode is a platinum metal electrode having an average grain size greater than 50 nm and wherein a piezoelectric thin film adjacent the platinum metal electrode comprises a laminate having a plurality of piezoelectric thin film layers wherein a piezoelectric thin film layer contacting the platinum metal electrode comprises PZT of composition at or about $PbZr_xTi_{1-x}O_3$ where $0<x\leq0.60$ and has a degree of pseudo cubic {100} orientation greater than or equal to 90%.

In one embodiment, the PZT thin film layer contacting the platinum metal electrode comprises lead zirconate titanate of composition at or about $PbZr_xTi_{1-x}O_3$ where $0<x\leq0.40$, for example 0.10, 0.20 or 0.30. In another embodiment, the PZT thin film layer contacting the platinum metal electrode comprises lead zirconate titanate of composition at or about $PbZr_xTi_{1-x}O_3$ where $0.40\leq x\leq0.60$, for example, at or about the MPB value. The MPB value is the value of x at the morphotropic phase boundary (MPB) between the tetragonal and rhombohedral phases of PZT.

Note, however, that a reference to lead zirconate titanate includes a reference to a doped lead zirconate titanate in which one or more of a dopant ion A or B nominally replace Pb (A site) or Zr or Ti (B site) ion. The MPB value may vary from 0.52 depending on whether one or more of a dopant ion is present. The MPB value may differ from 0.52 by, for example, up to +/−5% or higher when one or more dopant ion is present. Note further that the lead content may be non-stoichiometric to the extent that a perovskite structure is maintained—especially when one or more dopant ion is present.

The PZT thin film layer contacting the platinum metal electrode may, for example, comprise lead zirconate titanate of composition $(Pb_{1-z}A_z)(Zr_xTi_{1-x})O_3$ or $Pb[Zr_x(Ti_{1-x})_{1-y}B_y]O_3$ where x may have the range of values mentioned above and y and z are less than or equal to 0.20.

In one embodiment, the PZT thin film layer contacting the platinum metal electrode has a degree of pseudo cubic {100} orientation greater than or equal to 95%, for example, 98% or even 100%.

The platinum metal electrode may have an average grain size of greater than 50 nm. Preferably, however, the average grain size is greater than 100 nm, for example, 150 nm, 175 nm, 200 nm, 250 nm, 300 nm, 400 nm or 500 nm.

The density of the grains, which depends on the average grain size, is well below that for a room temperature deposited platinum electrode (about 1600 grains per square micrometre; average grain size 20 nm to 30 nm). The density of the grains may, in particular, range between about 25 grains per square micrometre and about 400 grains per square micrometre.

In one embodiment, the platinum metal electrode has a preferred (111) orientation. The thickness of the platinum metal electrode may be between 10 nm and 200 nm, and in particular, 50 nm, 100 nm or 150 nm.

The PZT thin film layer contacting the platinum metal electrode may be doped by one or more of a donor dopant, an acceptor dopant or an isovalent dopant. The, or each, dopant may be present in an amount up to 20 mol %, for example, 2 mol %, 5 mol %, 10 mol % or 15 mol %.

A donor dopant may be selected from the group of dopants consisting of $La^{3+}$, $Ta^{5+}$, $V^{5+}$, $U^{5+}$, $Nb^{5+}$ and $W^{6+}$ as well as trivalent ions of the rare earth elements.

An acceptor dopant may be selected from the group of dopants consisting of $Na^+$, $K^+$, $Cs^+$, $Rb^+$, $Cu^+$, $Mn^+$, $Cu^{2+}$, $Co^{2+}$, $Mn^{2+}$, $Nb^{2+}$, $Ni^{2+}$, $Mn^{3+}$, $V^{3+}$, as well as divalent and trivalent ions of the alkaline earth and rare earth elements.

An isovalent dopant may be selected from the group of dopants consisting of $Mn^{4+}$, $Hf^{4+}$, $Sn^{4+}$, $Mg^{2+}$, $Ca^{2+}$, $Sr^{2+}$ and $Ba^{2+}$ as well as other divalent ions of the alkaline earth and rare earth metals.

In one embodiment, the laminate comprises a laminate in which all the piezoelectric thin film layers are chemical solution derived thin film layers.

In another embodiment, the laminate comprises a laminate in which the PZT thin film layer contacting the platinum electrode is a chemical solution derived layer and one or more other piezoelectric thin film layers are derived by one of the other methods mentioned above, in particular, by low temperature sputtering or metallo-organic chemical vapour deposition.

In these embodiments, one or more piezoelectric thin film layers other than the PZT thin film layer contacting the platinum electrode can comprise a perovskite other than PZT. These layers may, for example, comprise one or more of $PbMg_{1/3}Nb_{2/3}O_3$ (PMN), $PbNi_{1/3}Nb_{2/3}O_3$ (PNN), $Pb_{(1-x)/2}La_xTiO_3$, (PLT), $PbZn_{1/3}Nb_{2/3}O_3$ (PZN) or $PbTiO_3$ (PT), a lead-free perovskite such as $BaTiO_3$ or binary or tertiary mixtures thereof such as PZT-PMN, PZT-PNN, PZT-PLT or PZN-PT.

In one embodiment, the laminate comprises a plurality of PZT thin film layers of composition at or about $PbZr_xTi_{1-x}O_3$ where $0<x\leq0.60$ formed on the PZT thin film layer contacting the platinum metal electrode. The laminate may, in particular, comprise a laminate in which all the PZT thin film layers other than the PZT thin film layer contacting the platinum electrode have composition at or about $PbZr_xTi_{1-x}O_3$ where $0.40\leq x\leq0.60$, for example, at or about the MPB value. The MPB value may vary from 0.52 depending on whether one or more of a dopant ion is present. The MPB value may differ from 0.52 by, for example, up to +/−5% or higher when one or more dopant ion is present.

The thickness of the PZT thin film layer contacting the platinum metal electrode is not particularly important and may, for example, be between 10 nm and 200 nm. In one embodiment, the thickness is between 40 nm and 100 nm, for example 45 nm, 50 nm, 55 nm, 60 nm, 65 nm, 70 nm, 75 nm or 80 nm.

Note that the PZT thin film layer contacting the platinum electrode acts as an orientation-controlling layer for the one or more other piezoelectric thin film layers in the laminate so that the thin film has overall a preferred pseudo cubic {100} orientation.

In some embodiments, the pseudo cubic {100} orientation of the piezoelectric thin film is greater than 90%, and in particular, greater than 95%, for example, 98% or more and even 100%.

The second electrode may comprise any suitable conducting material and may be formed on the piezoelectric thin film by any method known to the art. It may, for example, be formed by sputtering platinum, iridium or ruthenium and/or by reactive sputtering of conductive oxides such as iridium oxide (IO, $IrO_2$), lanthanum niobate (LNO, $LaNiO_3$) or strontium ruthenate (SRO, $SrRuO_2$).

In one embodiment, the second electrode is a top electrode and the piezoelectric thin film is interposed between the first and second electrodes.

In this embodiment, one or more additional piezoelectric thin films and one or more additional electrodes may be provided so that the piezoelectric thin film element comprises a stack of alternate piezoelectric thin films and electrodes. The additional electrodes may also be high-temperature deposited platinum electrodes and the additional piezoelectric thin films may be similar to the piezoelectric thin film which is formed on the first electrode. The electrode and doping arrangements may otherwise be similar to those described in U.S. provisional patent application No. 63/175,056 (incorporated by reference herein).

In another embodiment, the first and second electrodes are provided on one surface of the piezoelectric thin film, for example, as an adjacent or interdigitated pair.

In a second aspect, the present disclosure provides a method for manufacturing a piezoelectric thin film element comprising a first electrode, a second electrode and one or more piezoelectric thin films there between, which method comprises forming a platinum metal electrode on a substrate heated to a predetermined temperature at or above 450° C. and forming a piezoelectric thin film comprising a laminate of piezoelectric thin film layers on the platinum metal electrode wherein the forming of the piezoelectric thin film comprises forming a piezoelectric thin film layer contacting the platinum metal electrode by a chemical solution deposition employing a solution having a predetermined excess lead content between 10 mol % and 40 mol % whereby the piezoelectric thin film layer contacting the platinum metal electrode comprises lead zirconate titanate (PZT) of composition at or about $PbZr_xTi_{1-x}O_3$ where $0<x\leq0.60$ and has a degree of pseudo cubic {100} orientation greater than or equal to 90%.

In one embodiment, the chemical solution deposition employs a solution having a predetermined excess lead content between 10 mol % and 40 mol % whereby the piezoelectric thin film layer contacting the platinum metal electrode comprises lead zirconate titanate of composition at or about $PbZr_xTi_{1-x}O_3$ where $0<x\leq0.40$, for example, 0.10, 0.20 or 0.30. In another embodiment, the chemical solution deposition employs a solution having a predetermined excess lead content between 10 mol % and 40 mol % whereby the piezoelectric thin film layer contacting the platinum metal electrode comprises lead zirconate titanate of composition at or about $PbZr_xTi_{1-x}O_3$ where $0.40\leq x\leq0.60$, for example, at or about the MPB value.

Note that a reference herein to a solution includes a reference to a sol-gel solution as well as a reference to a solution which does not develop a sol or a gel during deposition. Note also that these solutions differ only in the solubility of the selected precursor compounds and that the steps for applying these solutions and forming piezoelectric thin film layers are substantially similar. References to a solution or to a chemical solution derived thin film layer are to be interpreted accordingly.

Note also that a reference to mol % excess lead content in a solution is a reference to a number of moles of lead in the solution which exceeds the number of moles necessary for forming a PZT thin film layer with stoichiometric amount of lead ion.

Thus, a reference to a solution comprising a 12 mol % excess lead content is a reference to a solution in which the number of moles of soluble lead is 12% higher than the number of moles of lead required for a PZT based thin film layer with stoichiometric amount of lead ion.

Such a solution may be said to contain an amount of lead corresponding to $Pb_{1.12}Zr_{0.52}Ti_{0.48}O_3$, for example, although the solution may actually provide a PZT thin film layer comprising $Pb_{\sim1.00}Zr_{0.52}Ti_{0.48}O_3$ viz., with an amount of lead slightly below or above 1.00 (by up to 5%).

Note further that the reference applies to a solution including a dopant precursor compound notwithstanding that the solution may provide a doped PZT thin film layer having a non-stoichiometric amount of lead as long as a perovskite structure is obtained.

The predetermined excess lead content of a solution including a dopant precursor compound may, therefore, have different (for example, higher) mol % excess lead content as compared to the excess lead content of a solution without the dopant precursor compound.

The forming of the PZT thin film layer contacting the platinum metal electrode may, in particular, employ a solution having a predetermined excess lead content of between 10 mol % and 40 mol %, in particular, between 12 mol % and 20 mol %, for example, 14 mol %, 16 mol %, 17 mol % or 18 mol %.

In one embodiment, the forming of the platinum metal electrode is by sputtering platinum metal on to a substrate which is heated from below to a temperature less than or equal to 1000° C. and, in particular, less than or equal to 650° C., for example, 500° C. or 600° C.

The substrate may comprise a silicon crystal. The silicon crystal may be provided with an adhesion layer, for example, comprising one or more of titanium oxide, zinc oxide, indium oxide or gallium oxide, for facilitating the deposition of the platinum metal electrode. The silicon crystal may also be provided with a buffer layer (for example, silica) and/or a lead barrier layer (for example, alumina, hafnia or zirconia) which contacts the adhesion layer or the platinum electrode layer.

In one embodiment, the forming of the PZT thin film layer contacting the platinum electrode employs a sol-gel solution which is made up from a commercially available sol-gel solution having a total weight concentration of precursor compounds for lead zirconate titanate equal to or greater than 10 wt % (the remainder being a solvent such as 2-methoxyethanol). Suitable commercially available sol-gel solutions (Mitsubishi Materials) include 12 wt %, 15 wt % or 25 wt % sol-gel solutions.

In this embodiment, the excess lead content of the sol-gel solution (which is 10 mol %) may be adjusted by adding a predetermined weight of lead precursor compound.

In another embodiment, the forming of the PZT thin film layer contacting the platinum electrode employs a solution which is made up from scratch to a suitable total weight concentration of precursor compounds for lead zirconate titanate based material with a weight ratio of precursor compounds providing the predetermined excess lead content in the solution.

In one embodiment, the forming of the PZT thin film layer contacting the platinum electrode employs a solution including one or more of a doping compound providing that the PZT thin film layer contacting the platinum metal electrode is doped by one or more of a donor dopant, an acceptor dopant or an isovalent dopant.

The solution may, in particular, comprise one or more doping compounds in concentrations up to 20 mol % (each), for example, up to 15 mol % or 10 mol %, and for example, 2 mol %, 5 mol % and 8 mol % (each).

Suitable precursor compounds and solvents for forming appropriate solutions are well known to those skilled in the art and are described, for example, in EP 2 525 391 A2.

Note that a reference to mol % of doping compound in a solution is a reference to a % ratio in the number of moles of doping compound in the solution as compared to the number of moles necessary for forming an undoped PZT thin film layer with stoichiometric amount of A or B site ion depending on which of these sites the dopant nominally occupies.

The doping precursor compound may be added to the commercial solutions mentioned above or made up so that it is present in addition to, rather than by substitution of, the proportions of precursor compounds used for forming an undoped PZT thin film layer.

The forming of a doped PZT thin film layer contacting the platinum metal electrode may employ a solution in which the predetermined excess lead content is greater than or equal to that of the solution employed for an undoped PZT thin film layer contacting the platinum metal electrode.

The doping compound may provide that the PZT thin film layer contacting the platinum metal electrode is doped by a donor dopant selected from the group consisting of $La^{3+}$, $Ta^{5+}$, $V^{5+}$, $U^{5+}$, $Nb^{5+}$ and $W^{6+}$ as well as trivalent ions of the rare earth elements.

The doping compound may provide that the PZT thin film layer contacting the platinum metal electrode is doped by an acceptor dopant selected from the group consisting of $Na^+$, $K^+$, $Cs^+$, $Rb^+$, $Cu^+$, $Li^+$, $Cu^{2+}$, $Co^{2+}$, $Mn^{2+}$, $Nb^{2+}$, $Ni^{2+}$, $Mn^{3+}$, $Y^{3+}$, as well as divalent and trivalent ions of the alkaline earth and rare earth elements.

The doping compound may provide that the PZT thin film layer contacting the platinum metal electrode is doped by an isovalent dopant selected from the group consisting of $Mn^{4+}$, $Hf^{4+}$, $Mg^{2+}$, $Ca^{2+}$, $Sr^{2+}$ and $Ba^{2+}$ and other divalent ions of the alkaline earth and rare earth elements.

In one embodiment, the doping compound provides that the PZT thin film layer contacting the platinum metal electrode is doped by $Nb^{5+}$. In this embodiment, the solution may, in particular, be $Pb_{1.17}Nb_{0.02}(Zr_{0.52}Ti_{0.48})O_3$.

The forming of the PZT thin film layer contacting the platinum electrode may comprise applying the solution by any method known to the art and, in particular, by spin-coating or dip coating. In one embodiment, the forming of the PZT thin film layer contacting the platinum electrode comprises spin coating a 12 wt % or a 15 wt % sol-gel solution at a rate between 1500 to 6000 rpm, for example, 1500 to 3000 rpm for duration between 30 seconds and 120 seconds whereby to obtain a thickness of the piezoelectric thin film layer contacting the platinum metal electrode of between 10 nm and 200 nm. Preferably, the spin rate is selected to provide a thickness between 45 nm, 50 nm, 55 nm, 60 nm or 65 nm, and 70 nm, or 80 nm.

In one embodiment, the method further comprises forming one or more additional piezoelectric thin film layers by a chemical solution deposition or by one of the other methods mentioned above, in particular, by low temperature sputtering or metallo-organic chemical vapour deposition.

In these embodiments, the method may comprise forming the one or more additional piezoelectric thin film layers as a perovskite other than PZT, for example, one or more of $PbMg_{1/3}Nb_{2/3}O_3$ (PMN), $PbNi_{1/3}Nb_{2/3}O_3$ (PNN), $Pb_{(1-x)/2}La_xTiO_3$, (PLT), $PbZn_{1/3}Nb_{2/3}O_3$ (PZN) or $PbTiO_3$ (PT), a lead-free perovskite such as $BaTiO_3$ or binary or tertiary mixtures thereof such as PZT-PMN, PZT-PNN, PZT-PLT or PZN-PT.

In one embodiment, the method further comprises forming one or more additional PZT thin film layers comprising lead zirconate titanate of composition at or about $PbZr_xTi_{1-x}O_3$ where $0<x\leq0.60$. It may, in particular, comprise forming one or more additional PZT thin film layers comprising lead zirconate titanate of composition at or about $PbZr_xTi_{1-x}O_3$ where $0.40\leq x\leq0.60$, for example, at or about the MPB value, on the piezoelectric thin film layer contacting the platinum metal electrode by chemical solution deposition.

Note that the PZT thin film layer contacting the platinum electrode acts as an orientation-controlling layer for the one or more additional piezoelectric thin film layers so that the thin film has overall a preferred pseudo cubic {100} orientation.

In some embodiments, the pseudo cubic {100} orientation of the piezoelectric thin film is greater than or equal to 90%, and in particular, greater than 95%, for example, 98% or more and even 100%.

The forming of one or more additional lead-containing thin film layers, and in particular additional PZT thin film layers, may employ one or more solutions having a predetermined excess lead content which is equal to or less than the solution employed for the PZT thin film layer contacting the platinum metal electrode.

The solution or solutions may include one or more doping compounds and the forming of the one or more additional PZT thin film layers may employ solutions providing that the PZT thin film layers include differently or similarly doped layers and optionally, undoped layers.

The predetermined excess lead content of the solution employed for the PZT thin film layer contacting the platinum metal electrode will depend on the texture and thickness of the electrode, in particular, on the grain size and relative density of the electrode.

In general, a lower excess lead content can be used when the grain size is large and/or the grain boundaries are dense. The predetermined excess lead content may also depend on the nature of any adhesion layer and its affinity to lead or on the presence of a lead barrier layer.

The predetermined excess lead content of the solutions employed for each of the lead-containing thin film layers making up the laminate will also depend to some extent on lead partial pressure (if a furnace is used) and the precise process conditions for drying, pyrolyzing and annealing.

However, the lead partial pressure in the furnace and the process conditions used are within conventional limits. The drying may comprise heating to a temperature of between 60° C. and 250° C., for example, between 100° C. and 200° C. for 2 or 3 minutes and the pyrolysis may comprise heating to a temperature of between 150θc and 500° C., for example, between 200° C. and 400° C. and, in particular to 350° C. for 1 to 10 minutes. The drying and pyrolysis may, however, comprise a single step employing appropriate temperature ramps and temperatures.

The annealing or crystallisation step may comprise heating to a temperature between 550° C. and 800° C., for example, between 600° C. and 800° C. and, in particular, 700° C. The annealing may be accomplished by a rapid thermal processing of duration 30 to 300 seconds or 15 minutes to 30 minutes in a furnace heated to the chosen temperature.

In one embodiment, the method comprises forming the platinum metal electrode on the substrate whereby to obtain a platinum metal electrode having a preferred (111) orientation.

The method may further comprise forming the second electrode by sputtering platinum, iridium or ruthenium and/or by reactive sputtering of a metal oxide, such as iridium oxide, lanthanum niobate or strontium ruthenate.

In a third aspect, the present disclosure provides an actuator for a droplet deposition head which actuator comprises a piezoelectric element according to the first aspect of the disclosure.

In a fourth aspect, the present disclosure provides a droplet deposition head for a droplet deposition apparatus, which droplet deposition head comprises an actuator according to the third aspect of the present disclosure. The droplet deposition head may be an inkjet printhead and, in particular, a drop-on-demand inkjet printhead.

In a fifth aspect, the present disclosure provides a droplet deposition apparatus comprising a droplet deposition head according to the fourth aspect of the present disclosure. The droplet deposition apparatus may be an inkjet printer and, in particular, a drop-on-demand inkjet printer.

In a sixth aspect, the present invention provides a solution for forming a pseudo cubic {100} orientated piezoelectric thin film layer on a platinum electrode having an average grain size greater than 50 nm, which solution comprises precursor compounds for lead zirconate titanate (PZT) in proportions providing a PZT thin film layer of composition at or about $PbZr_xTi_{1-x}O_3$ where $0<x\leq 0.60$, and an excess lead content greater than 10 mol % and less than or equal to 40 mol %.

The solution may, in particular, comprise precursor compounds for lead zirconate titanate (PZT) in proportions providing a PZT thin film layer of composition at or about $PbZr_xTi_{1-x}O_3$ where $0<x\leq 0.40$ or $0.40\leq x\leq 0.60$, for example, at or about the MPB value, and an excess lead content between 12 mol % and 20 mol % and, optionally, one or more doping compound up to 20 mol % each.

The solution may, in particular, be $Pb_{1.14}Nb_{0.02}(Zr_{0.52}Ti_{0.48})O_3$, or $Pb_{1.13}Mn_{0.01}(Zr_{0.52}Ti_{0.48})O_3$. Other embodiments in this aspect will be apparent from the first and second aspects of the present disclosure.

Certain embodiments are now described in detail with reference to the following experimental data and the accompanying drawings in which.

Figure 3:
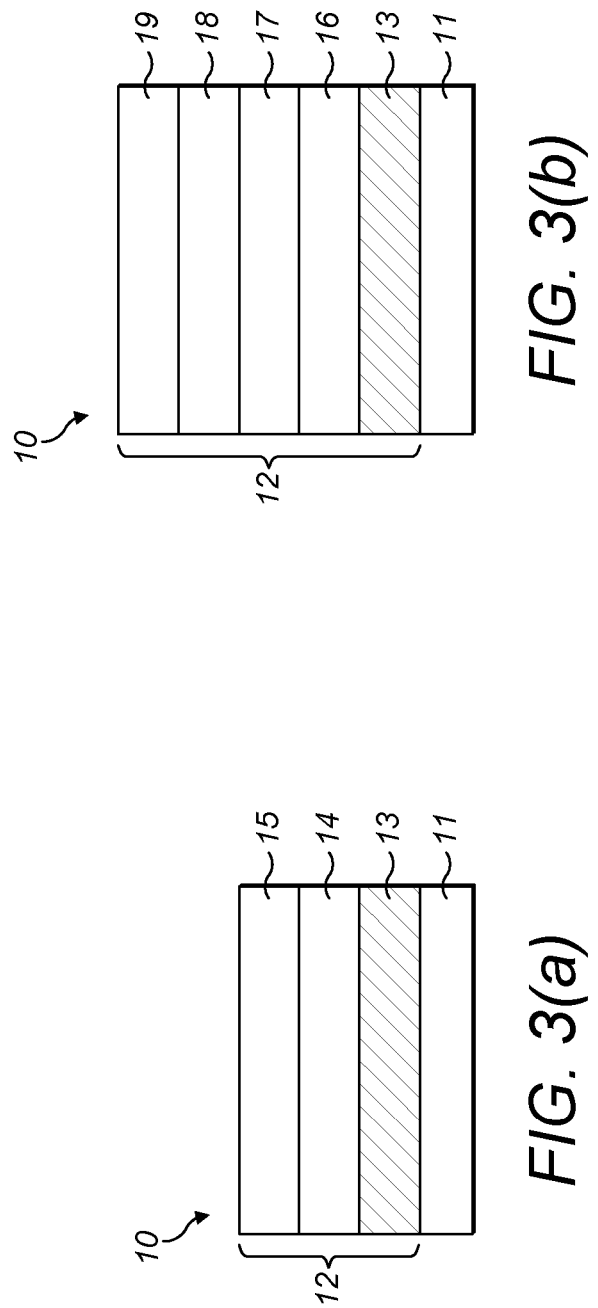
Figure 4:
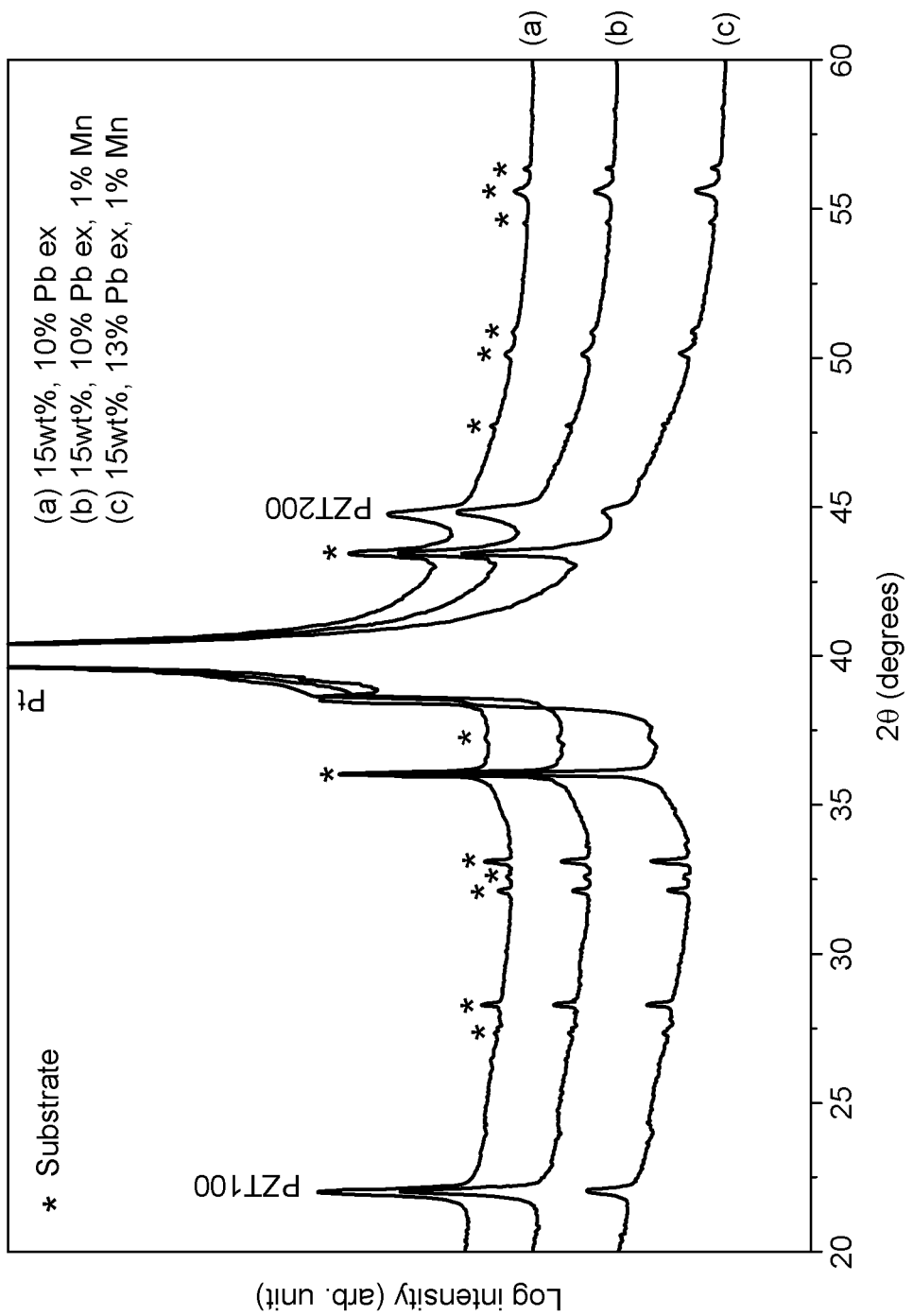
Figure 5:
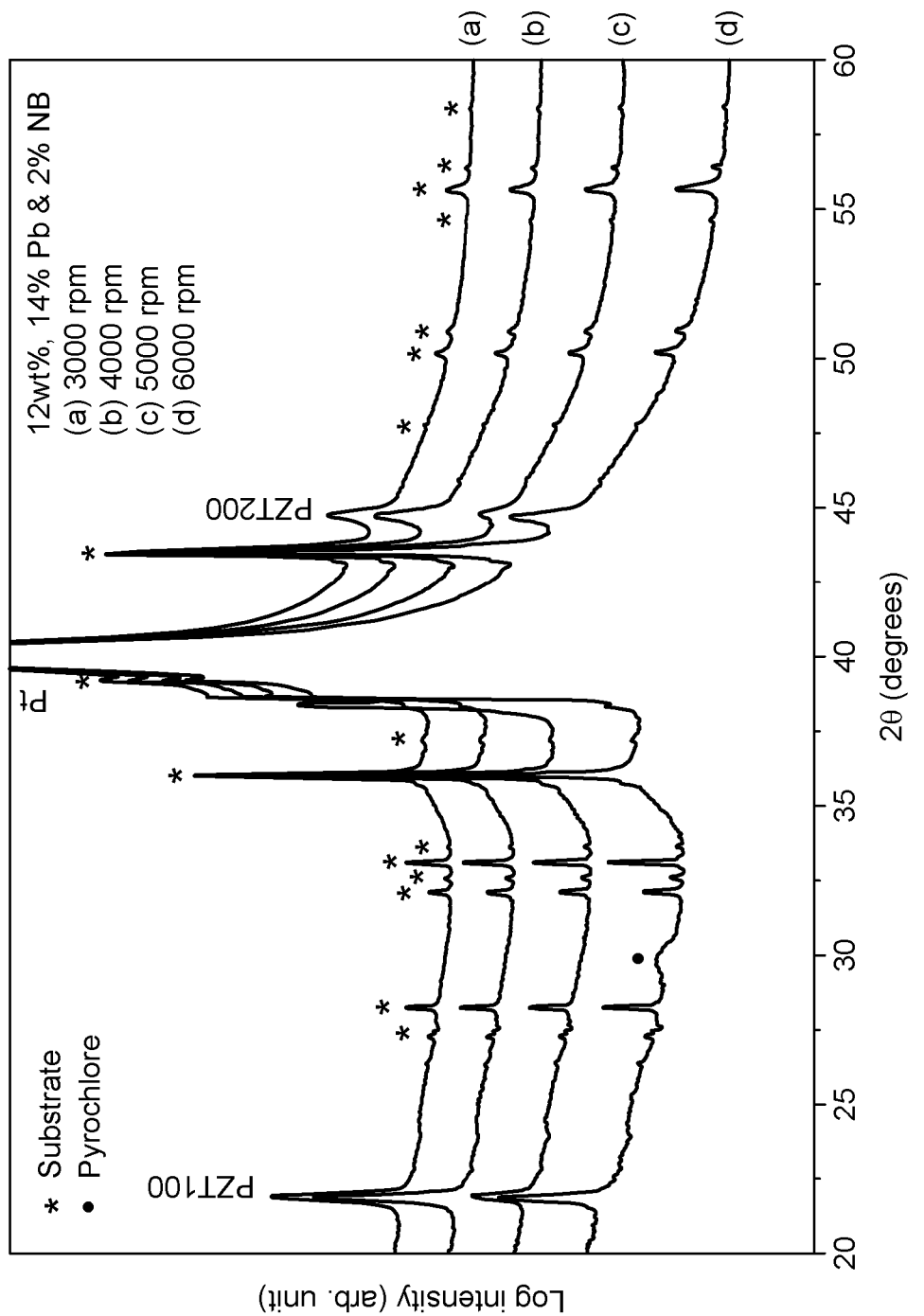
Figure 6:
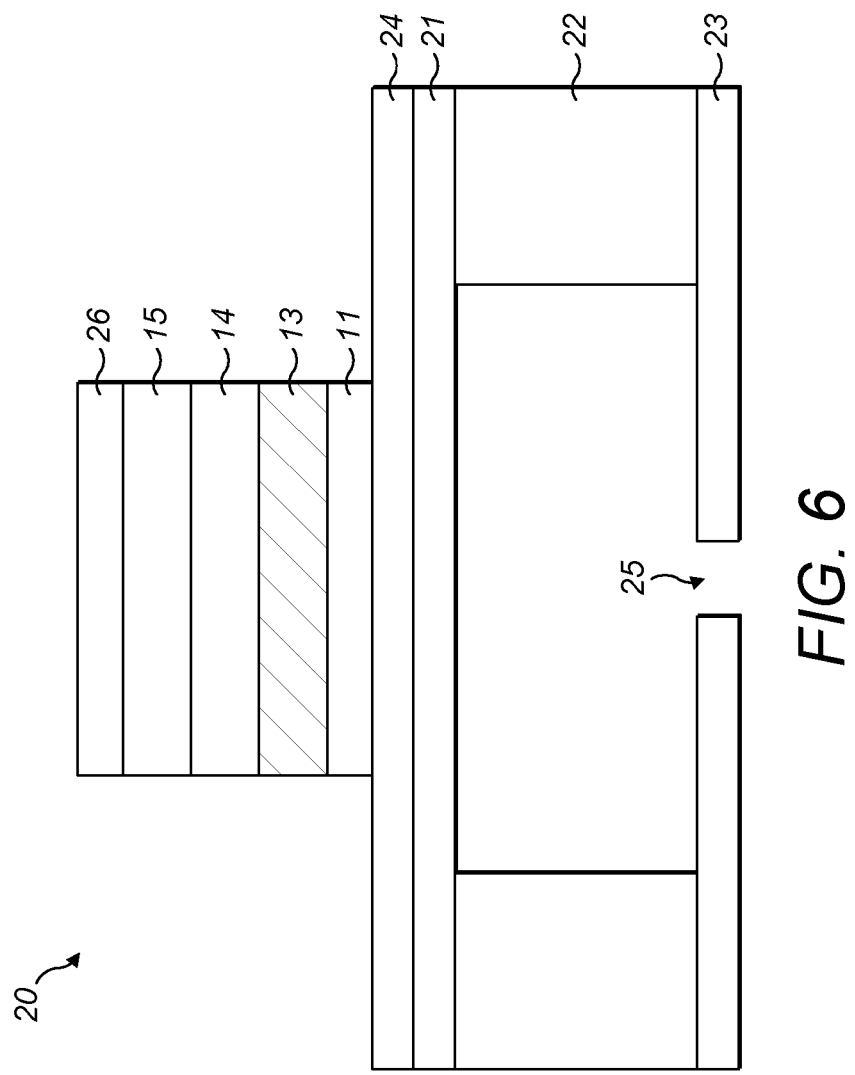

FIGS. 3 (*a*) and (*b*) show two embodiments of a piezoelectric thin film element according to the present disclosure;

FIG. 4 show X-ray diffraction patterns for piezoelectric thin films comprising doped and undoped lead zirconate titanate (PZT) of composition at or about $PbZr_{0.52}Ti_{0.48}O_3$ which are deposited onto a high-temperature deposited platinum electrode;

FIG. 5 shows X-ray diffraction patterns for piezoelectric thin films comprising doped lead zirconate titanate (PZT) of composition at or about $PbZr_{0.52}Ti_{0.48}O_3$ which are deposited onto a high-temperature deposited platinum electrode to varying degrees of thickness; and FIG. 6 shows one embodiment of a piezoelectric actuator according to the present disclosure.

Figure 1:
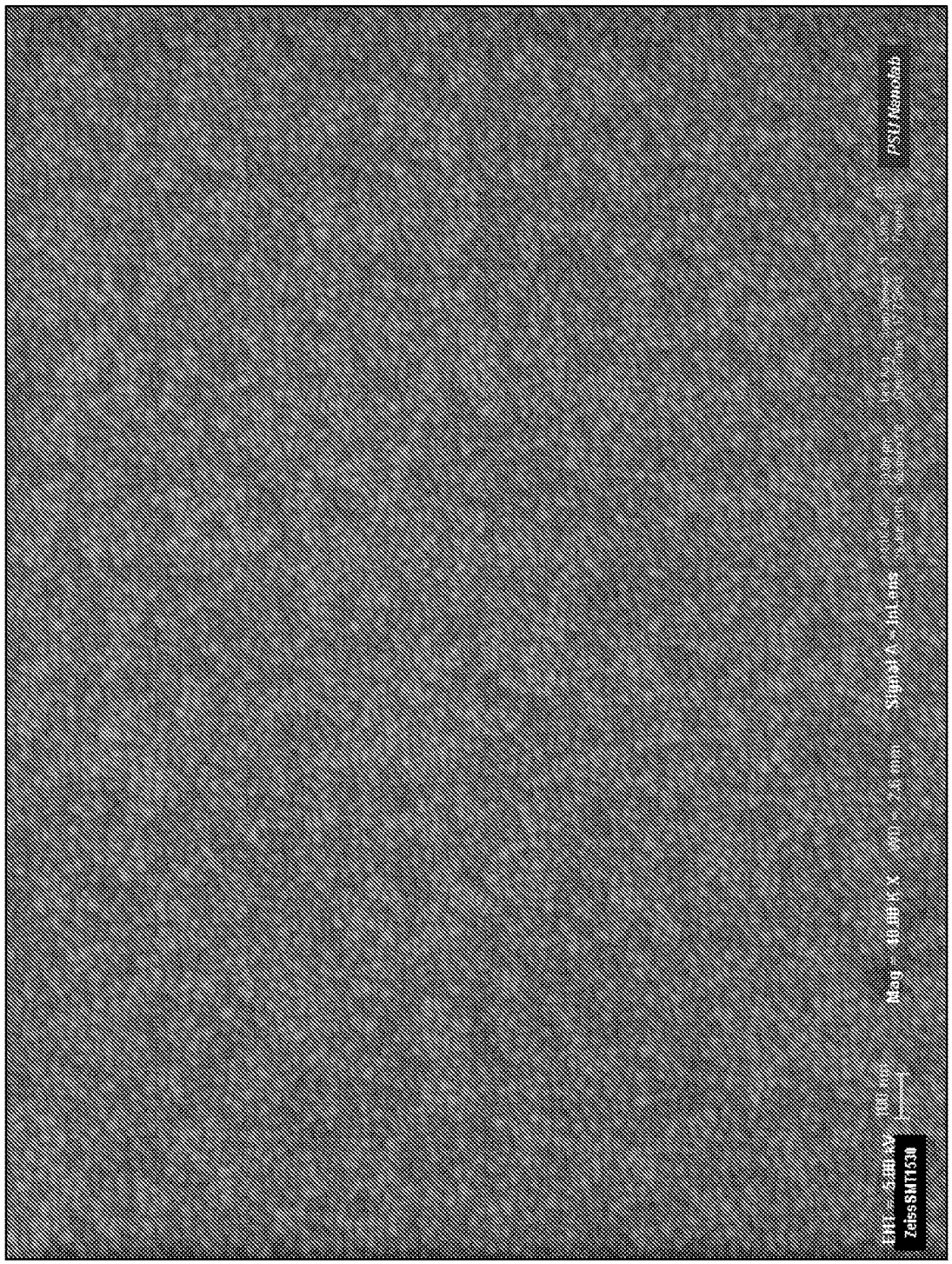
FIG. 1 shows a scanning electron microscope (SEM) image of a platinum electrode obtained by sputtering platinum metal onto a silicon substrate held at room temperature.

Referring now to FIG. 1, a SEM image shows the microstructure of a platinum electrode deposited on to a silicon substrate by sputtering platinum metal. The silicon substrate is held at room temperature (RT) throughout the process. As may be seen, the platinum electrode has a very fine grain size—which is determined to be about 20 nm to 30 nm.

Figure 2:
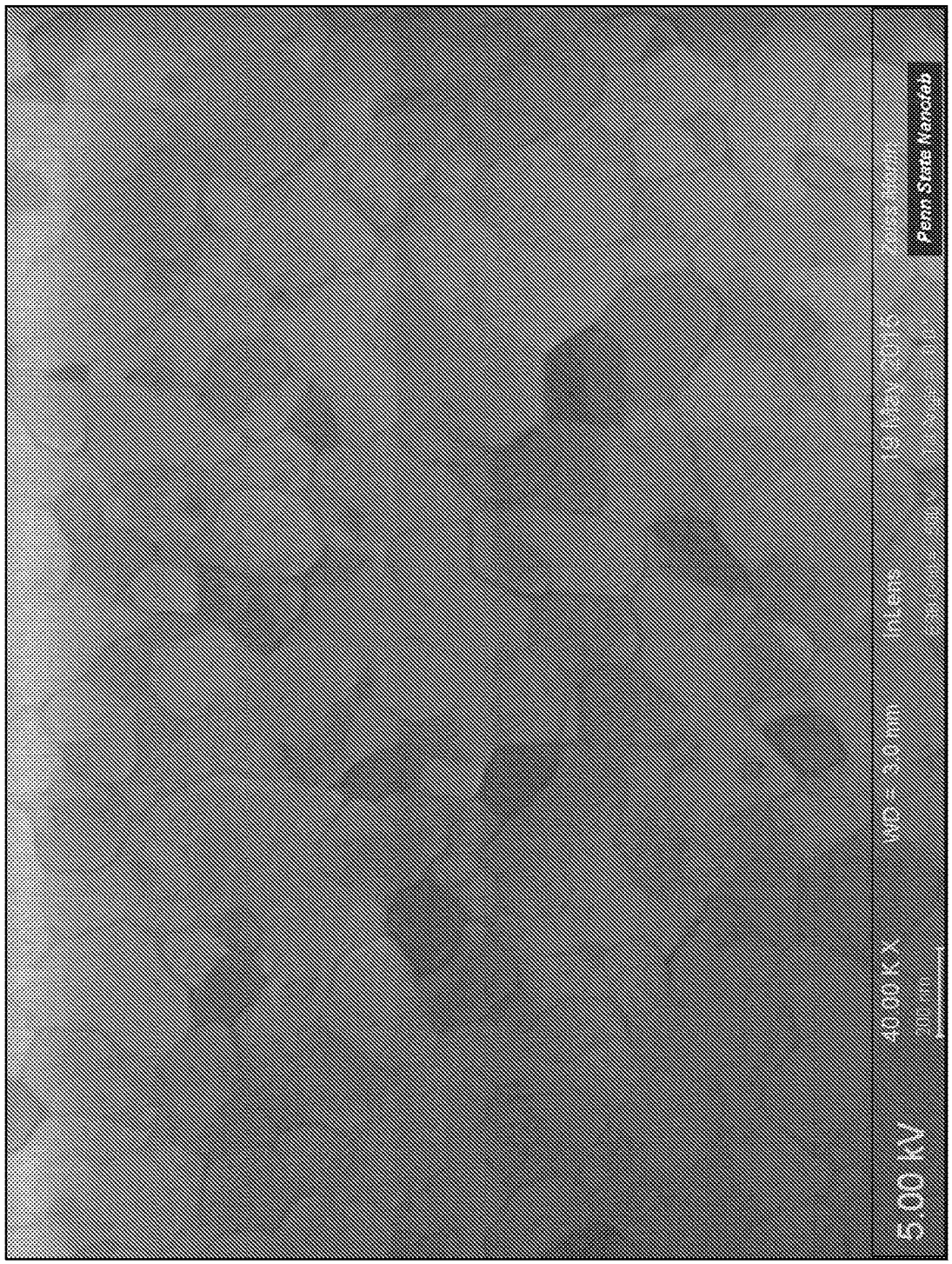
FIG. 2 shows a scanning electron microscope (SEM) image of a platinum electrode obtained by sputtering platinum metal onto a silicon substrate heated from below to 500° C.

The SEM image of FIG. 2 shows the microstructure of a platinum electrode deposited on to a silicon substrate provided by sputtering platinum metal under similar conditions to those described in U.S. Pat. No. 6,682,722 B1 (see Example 1 below). The silicon substrate is held at a temperature of 500° C. throughout the process. As may be seen, the platinum electrode has a larger lateral grain size as compared to that shown in SEM image of FIG. 1—which is determined to be about 200 nm.

The texture for each of the platinum electrodes was determined by peak-force tapping mode atomic force microscopy (AFM) analysis of surface roughness R using a Bruker Dimension Icon AFM apparatus in open-loop mode and by rocking curve X-ray diffraction (XRD) measurements using Phillips Pro MRD 4-Circle XRD apparatus.

AFM images were collected using a Bruker ScanAsyst-Air probe (an uncoated, etched silicon tip on a nitride lever) using Bruker NanoScope software (v 8.1.5).

The XRD measurements determined the full width at half maximum (FWHM) from the rocking curve obtained for the platinum 111 peak identified in a 2θ scan. The scan axis was omega and the range about 4° with step size 0.01° at frequency 0.5 Hz.

TABLE 1

|  | Pt on substrate (sputtered at RT) | Pt on substrate (sputtered at 500° C.) |
|---|---|---|
| $R_{max}$ (Z range)/nm | 11.9 | 11.3 |
| $R_q$ (root mean square)/nm | 0.95 | 1.23 |
| $R_a$ (arithmetic average)/nm | 0.75 | 0.97 |
| Pt 111 rocking curve FWHM/° | 4.7 | 1.5 |

Table 1 shows the Pt 111 rocking curve FWHM and roughness (R) data and that the platinum electrode deposited on the heated silicon substrate has a much higher quality of crystallinity as compared to that deposited on a silicon substrate held at room temperature.

Referring now to FIG. 3 (*a*), a piezoelectric thin film element 10 according to one embodiment of the present disclosure comprises a platinum metal electrode 11 deposited by sputtering on a silicon substrate provided with a $TiO_x$ adhesion layer (not shown) which is heated from below to a temperature above 450° C.

A PZT thin film (12) provided on the electrode comprises a laminate of three PZT thin film layers (13, 14 and 15) of composition at or about $PbZr_{0.52}Ti_{0.48}O_3$. A top electrode (shown in FIG. 5 as 26) provided on the laminate is formed, for example, by sputtering platinum, iridium or ruthenium and/or by reactive sputtering of iridium dioxide.

The PZT thin film layer contacting the platinum electrode (13; shown with hash lines) is formed by a sol-gel deposition in which the sol-gel solution has a predetermined excess lead content greater than 10 mol % and has a degree of pseudo cubic {100} orientation equal to or greater than 90%. The overlying PZT thin film layers (14 and 15) are also formed by a sol-gel process in which the sol-gel solution has a predetermined excess lead content equal to 10 mol % and have a degree of pseudo cubic {100} orientation similar to or identical to that of the PZT thin film layer (13).

FIG. 3 (*b*) shows a piezoelectric thin film element which differs from that shown in FIG. 3 (*a*) in that the laminate comprises five PZT thin film layers which are formed by a hybrid process.

The PZT thin film layer contacting the platinum electrode (13, shown with hash lines) is formed by a sol-gel deposition in which the sol-gel solution has a predetermined excess lead content greater than 10 mol % and has a degree of pseudo cubic {100} orientation greater than or equal to 90%. The overlying PZT thin film layers (16 to 19) are formed by metallo-organic chemical vapour deposition (employing similar annealing steps) and have a degree of pseudo cubic {100} orientation similar or identical to that of the PZT thin film (13).

Referring now to FIG. 4, an X-ray diffraction pattern (a) of a piezoelectric thin film layer comprising lead zirconate titanate (PZT) of composition at $PbZr_{0.52}Ti_{0.48}O_3$ deposited onto a high-temperature deposited platinum electrode by a sol-gel deposition using a 15 wt % sol-gel solution with lead excess of 10 mol % (a $Pb_{1.10}Zr_{0.52}Ti_{0.48}O_3$ solution) shows only 100 and 200 diffraction peaks (the peaks marked * are due to platinum electrode/silicon substrate).

An X-ray diffraction pattern (b) of a PZT thin film layer of composition about $PbZr_{0.52}Ti_{0.48}O_3$ which has been deposited onto a high temperature deposited platinum electrode by a sol-gel process using a 15 wt % sol-gel solution with lead excess of 10 mol % and 1 mol % of a manganese dopant compound (a $Pb_{1.10}Mn_{0.01}(Zr_{0.52}Ti_{0.48})O_3$ solution) also shows only 100 and 200 diffraction peaks.

An X-ray diffraction pattern (c) of a PZT thin film layer of composition about $PbZr_{0.52}Ti_{0.48}O_3$ which has been deposited onto a high temperature deposited platinum electrode by a sol-gel process using a 15 wt % sol-gel solution with a lead excess of 13 mol % and 1 mol % manganese dopant compound (a $Pb_{1.13}Mn_{0.01}(Zr_{0.52}Ti_{0.48})O_3$ solution) also shows only 100 and 200 diffraction peaks.

However, as may be seen, the intensity of the 100 and 200 diffraction peaks in the doped PZT thin film layer is much larger when the excess lead content of the sol-gel solution is 13 mol % as compared to 10 mol %.

The excess lead content of the sol-gel solution is, therefore, critical to crystallinity and initiation of pseudo cubic {100} orientation in the piezoelectric thin film layer.

Referring now to FIG. 5, X-ray diffraction patterns are shown for PZT thin film layers comprising lead zirconate titanate (PZT) of composition at or about $PbZr_{0.52}Ti_{0.48}O_3$ deposited onto a high-temperature deposited platinum electrode. The PZT thin film layers are deposited by spin coating a 12 wt % sol-gel solution with excess lead content of 14 mol % and 2 mol % niobium dopant compound (a $Pb_{1.14}Nb_{0.02}(Zr_{0.52}Ti_{0.48})O_3$ solution) at four different spin rates during 30 seconds.

The different spin rates (from top to bottom: (a) 3000 rpm, (b) 4000 rpm, (c) 5000 rpm and (d) 6000 rpm) lead to piezoelectric thin film layers of different thickness (45 to 80 nm from (d) to (a)).

As may be seen, the intensity of the 100 and 200 diffraction peaks is large in each diffraction pattern and of comparable size (the peaks marked * are due to platinum electrode/silicon substrate).

In other words, there is no direct dependency between the thickness of the piezoelectric thin film layer which is deposited on the high temperature deposited platinum electrode and the degree of pseudo cubic {100} orientation in that thin film layer. Piezoelectric thin film layers having high pseudo cubic {100} orientation can be obtained across a wide range of thicknesses.

EXAMPLE 1

Formation of PZT Thin Film Orientation-Controlling Layers on HT-Pt

A platinum electrode was deposited by RF magnetron sputtering (at 500 W DC cathode power during about 1 minute) of a platinum target (99.99% pure) of diameter 250 nm and thickness 4 mm under an argon atmosphere (50 sccm flow rate) on to silicon substrates (target-substrate distance 50 mm) heated from below to a temperature of 450° C. and 500° C. The deposition rate was 11.8 Å/s and the chamber pressure was 3.8 mTorr.

Sol-gel solutions of concentration about 12 wt % of lead zirconate titanate precursor compounds having different mol % excess lead content and different mol % dopant concentrations were deposited on to the electrode by spin coating at 3500 rpm for 45 seconds.

The coatings were dried and pyrolyzed at 200° C. during 150 seconds and annealed at 700° C. for 1 minute using a rapid thermal heating (RTA) apparatus (with 2 SLPM $O_2$ flow and 10° C./second temperature ramp). The final coatings had a composition at or about $PbZr_{0.52}Ti_{0.48}O_3$ and thickness of 60 nm.

The degree of pseudo cubic {100} orientation of the resultant piezoelectric thin film layers was determined by X-ray crystallography inspecting the relative intensities of the 100 diffraction peaks as compared to other diffraction peaks and evaluated in terms of Lotgering factor $LF_{100}$.

Table 2 summarises the results as compared with coatings of similar thickness formed on a platinum electrode deposited at room temperature. These coatings were formed under similar conditions and at similar thicknesses (except that pyrolysis was carried out at 100° for 60 seconds followed by 300° C. for 240 seconds). The degree of {100} orientation of the coatings on the high-temperature deposited platinum electrodes was in general excellent and compared well to those coatings formed on the room temperature platinum electrode.

TABLE 2

| | Degree of {100} Orientation | | |
|---|---|---|---|
| 12 wt % Solution Lead Excess; Dopant concentration | Pt on substrate (sputtered at RT) | Pt on substrate (sputtered at 450° C.) | Pt on substrate (sputtered at 500° C.) |
| 10 mol % Pb; undoped | E | E | E |
| 12 mol % Pb; undoped | E | E or M | B |
| 12 mol % Pb; 1 mol % $Mn^{2+}$ | B | M | E |
| 14 mol % Pb; 2 mol % $Nb^{5+}$ | E | E | E |
| *10 mol % Pb; 1.1 mol % $La^{3+}$ | E | E | E |

*15 wt % solution
(E = excellent, a Lotgering factor $LF_{100}$ greater than or equal to 0.98; M = mixture, a Lotgering Factor $LF_{100}$ is between 0.50 and 0.80; B = random orientation or poor crystallinity).

FIG. 6 shows a part section view of an actuator (20) in an inkjet printhead according to one embodiment of the present disclosure. The construction of the actuator and the inkjet printhead is conventional except that the piezoelectric thin film element according to the present disclosure is used. In this embodiment, the piezoelectric thin film element of FIG. 3 (a) is provided to a membrane (21) on top of a pressure chamber (22), provided with a nozzle plate (23).

The pressure chamber (22) may comprise a silicon single crystal of thickness about 70 μm and the membrane (21) may comprise a thin film comprising one or more of silicon dioxide, zirconium oxide, tantalum oxide, silicon, silicon nitride or aluminium oxide and the like.

A titanium oxide adhesion layer (24) of thickness about 20 nm is interposed between the membrane (21) and the platinum metal electrode (11).

In use, a predetermined drive voltage is applied between the electrodes (11 and 26) by a signal from a control circuit. The voltage causes the piezoelectric thin film element to deform so deflecting the membrane (21) into the pressure chamber (22) and changing its volume. A sufficient increase in pressure within the pressure chamber (22) causes fluid droplets to be ejected from the nozzle (25).

The present disclosure provides a simple and economic way to control pseudo cubic {100} orientation in a piezoelectric thin film element comprising piezoelectric thin films provided on a high-temperature deposited platinum electrode.

In particular, the PZT thin film orientation-controlling layer can be simply obtained by chemical solution deposition from a solution obtained from existing commercially available sol-gel solutions (12 wt %, 15 wt % and 25 wt %)—without the need to limit its thickness.

The present disclosure provides a method which avoids the use of lead titanate as a seed layer and minimises current leakage and capacitance effects associated with very large excess lead content (lead titanate requires up to 40 mol % excess lead content) which can lead to degradation of the performance of the piezoelectric element.

The use of a PZT thin film layer which is directly formed on the platinum electrode as an orientation-controlling layer and does not require control of thickness may also provide a more efficient manufacture of the piezoelectric element by minimizing the number of solutions to be used.

The solution employed for forming the PZT thin film layer contacting the platinum electrode may also be used in forming one or more other PZT thin film layer of the laminate.

The present disclosure provides a detailed description of certain embodiments of the piezoelectric thin film element. Note that other embodiments will be apparent to those skilled in the art which are not described in detail here.

Note also that a reference to a particular range of values (for example, average grain size) includes the starting and finishing values.

Note further that it is the accompanying claims which particularly point out an invention in the present disclosure and the scope of protection which is sought.

The invention claimed is:

1. A piezoelectric thin film element comprising:
a first electrode, the first electrode being a platinum metal electrode having an average grain size greater than 50 nm;
a second electrode; and
one or more piezoelectric thin films there between, wherein
the one or more piezoelectric thin films comprise a piezoelectric thin film adjacent the platinum metal electrode, the piezoelectric thin film comprising a laminate having a plurality of piezoelectric layers, and
the plurality of piezoelectric layers comprise a piezoelectric layer contacting the platinum metal electrode, the piezoelectric layer comprising lead zirconate titanate (PZT) of composition at or about $PbZr_xTi_{1-x}O_3$, where $0<x\leq0.60$, and having a degree of pseudo cubic {100} orientation greater than 90%.

2. The piezoelectric thin film element of claim 1, wherein the piezoelectric layer has a composition at or about $PbZr_xTi_{1-x}O_3$ where $0<x\leq0.40$.

3. The piezoelectric thin film element of claim 2, wherein the piezoelectric layer is doped by one or more of a donor dopant, an acceptor dopant, or an isovalent dopant.

4. A piezoelectric thin film element according to claim 2, wherein
the piezoelectric layer is a first piezoelectric layer;
the plurality of piezoelectric layers comprises at least one piezoelectric layer comprising lead zirconate titanate (PZT) of composition at or about $PbZr_xTi_{1-x}O_3$, where $0<x\leq0.60$, formed on the first piezoelectric layer.

5. The piezoelectric thin film element of claim 1, wherein the piezoelectric layer has a composition at or about $PbZr_xTi_{1-x}O_3$ where $0.40\leq x\leq0.60$.

6. The piezoelectric thin film element of claim 5, wherein the piezoelectric layer is doped by one or more of a donor dopant, an acceptor dopant, or an isovalent dopant.

7. A piezoelectric thin film element according to claim 5, wherein
the piezoelectric layer is a first piezoelectric layer;
the plurality of piezoelectric layers comprises at least a second piezoelectric layer comprising lead zirconate titanate (PZT) of composition at or about $PbZr_xTi_{1-x}O_3$, where $0<x\leq0.60$, formed on the first piezoelectric layer.

8. The piezoelectric thin film element of claim 1, wherein the piezoelectric layer is doped by one or more of a donor dopant, an acceptor dopant, or an isovalent dopant.

9. The piezoelectric thin film element of claim 5, wherein
the piezoelectric layer is a first piezoelectric layer; and
the plurality of piezoelectric layers comprise at least a second piezoelectric layer comprising lead zirconate titanate (PZT) of composition at or about $PbZr_xTi_{1-x}O_3$ where $0<x\leq0.60$, formed on the first piezoelectric layer.

10. A method for manufacturing a piezoelectric thin film element comprising:
forming a platinum metal electrode on a substrate heated to a predetermined temperature at or above 450° C.;
forming a piezoelectric thin film comprising a laminate of piezoelectric layers on the platinum metal electrode; and
forming a top electrode,
wherein
the forming of the piezoelectric thin film comprises forming a piezoelectric layer contacting the platinum metal electrode by a chemical solution deposition, the chemical solution deposition employing a solution having a predetermined excess lead content between 10 mol % and 40 mol %, and
the piezoelectric layer comprises lead zirconate titanate of composition at or about $PbZr_xTi_{1-x}O_3$ where $0<x\leq0.60$ and has a degree of pseudo cubic {100} orientation greater than or equal to 90%.

11. The method of claim 10, wherein
the forming of the piezoelectric layer employs a solution having a predetermined excess lead content between 10 mol % and 40 mol %, and
the piezoelectric layer comprises lead zirconate titanate of composition at or about $PbZr_xTi_{1-x}O_3$ where $0<x\leq0.40$.

12. The method of claim 11, wherein the chemical solution deposition employs a solution providing one or more of a donor dopant, an acceptor dopant, or an isovalent dopant in the piezoelectric layer.

13. The method of claim 11, wherein
the piezoelectric layer is a first piezoelectric layer;
the forming of the piezoelectric thin film further comprises forming at least a second piezoelectric layer comprising lead zirconate titanate (PZT) of composition at or about $PbZr_xTi_{1-x}O_3$, where $0<x\leq0.60$, on the first piezoelectric layer by a chemical solution deposition; and
the second piezoelectric layer has a degree of pseudo cubic {100} orientation greater than or equal to 90%.

14. The method of claim 10, wherein the chemical solution deposition employs a solution having a predetermined excess lead content between 12 mol % and 20 mol %.

15. The method of claim 14, wherein the chemical solution deposition employs a solution providing one or more of a donor dopant, an acceptor dopant, or an isovalent dopant in the piezoelectric layer.

16. The method of claim 14, wherein
the piezoelectric layer is a first piezoelectric layer;
the forming of the piezoelectric thin film further comprises forming at least a second piezoelectric layer comprising lead zirconate titanate (PZT) of composition at or about $PbZr_xTi_{1-x}O_3$, where $0<x\leq0.60$, on the first piezoelectric layer by a chemical solution deposition; and
the second piezoelectric layer has a degree of pseudo cubic {100} orientation greater than or equal to 90%.

17. The method of claim 10, wherein the chemical solution deposition employs a solution providing one or more of a donor dopant, an acceptor dopant, or an isovalent dopant in the piezoelectric layer.

18. The method of claim 10, wherein
the piezoelectric layer is a first piezoelectric layer;
the forming of the piezoelectric thin film further comprises forming at least a second piezoelectric layer comprising lead zirconate titanate (PZT) of composition at or about $PbZr_xTi_{1-x}O_3$, where $0<x\leq0.60$, on the first piezoelectric layer by a chemical solution deposition; and
the second piezoelectric layer has a degree of pseudo cubic {100} orientation greater than or equal to 90%.

19. A printhead for droplet deposition coupled to a control circuit comprising:
a first electrode comprising platinum having an average grain size greater than 50 nm;
a second electrode; and
piezoelectric thin films between the first electrode and the second electrode,
wherein
the control circuit is configured to apply a drive voltage between the first electrode and the second electrode, which causes the piezoelectric thin films to deform,
the piezoelectric thin films comprise a laminate having a plurality of piezoelectric layers, and
the plurality of piezoelectric layers comprise a piezoelectric layer contacting the platinum metal electrode, the piezoelectric layer comprising lead zirconate titanate (PZT) of composition at or about $PbZr_xTi_{1-x}O_3$, where $0<x\leq0.60$, and having a degree of pseudo cubic {100} orientation greater than 90%.

20. The printhead of claim 19, further comprising:
an adhesion layer in contact with the first electrode;
a membrane in contact with the adhesion layer;
a pressure chamber in contact with the membrane; and
a nozzle plate in contact with the pressure chamber,
wherein
the pressure chamber comprises silicon single crystal; and the membrane comprises a dielectric thin film.

* * * * *